United States Patent [19]

Smith

[11] Patent Number: 5,309,320
[45] Date of Patent: May 3, 1994

[54] CIRCUIT CARD ASSEMBLY CONDUCTION CONVERTER

[75] Inventor: William A. Smith, Laguna Hills, Calif.

[73] Assignee: Hughes Aircraft Company, Los Angeles, Calif.

[21] Appl. No.: 64,991

[22] Filed: May 14, 1993

Related U.S. Application Data

[63] Continuation of Ser. No. 936,057, Aug. 28, 1992, abandoned, which is a continuation of Ser. No. 651,675, Feb. 6, 1991, abandoned.

[51] Int. Cl.⁵ .............................................. H05K 7/20
[52] U.S. Cl. .................................. 361/704; 257/707; 174/52.2; 361/713
[58] Field of Search ............ 428/901; 124/52.2, 16.3, 124/252; 165/80.3, 185; 361/380, 383, 386, 387, 388, 389, 395, 400, 405, 704–707, 712, 713, 718, 719, 752; 257/702, 703, 705–707, 712, 713

[56] References Cited

U.S. PATENT DOCUMENTS

| | | | |
|---|---|---|---|
| 3,579,821 | 5/1971 | Kurisu | 29/627 |
| 3,679,941 | 7/1972 | LaCombe | 156/17 |
| 3,783,347 | 1/1974 | Vladik | 357/81 |
| 4,029,628 | 6/1977 | Fredberg | 428/901 |
| 4,092,697 | 5/1978 | Spaight | 361/386 |
| 4,199,548 | 4/1980 | Kaiho | 422/305 |
| 4,654,754 | 3/1987 | Daszkowski | 361/388 |
| 4,959,752 | 9/1990 | Samarov | 361/424 |
| 5,146,981 | 9/1992 | Samarov | 165/185 |

FOREIGN PATENT DOCUMENTS 1258488 12/1971 United Kingdom .............. 361/388

*Primary Examiner*—Gerald P. Tolin
*Attorney, Agent, or Firm*—W. K. Denson-Low

[57] ABSTRACT

A printed wiring board carries electronic components. A castable body is of thermally conductive dielectric material and is molded from the printed wiring board to the exact configuration of the electronic devices. A metal plate completes the conductive converter, which includes the castable body. The conductive converter can be clamped to a cold plate and a card box to conductively remove heat from the electronic components. The molding process may be direct molding of the castable body onto the electronic device side of the printed wiring board or may include indirect steps. Protection of the electronic devices and printed wiring board and filling of the undercuts may be accomplished by vacuum-forming an electrically conductive polymer sheet over the devices during molding followed by removing of the sheet when the thermal mounting plate is attached.

2 Claims, 3 Drawing Sheets

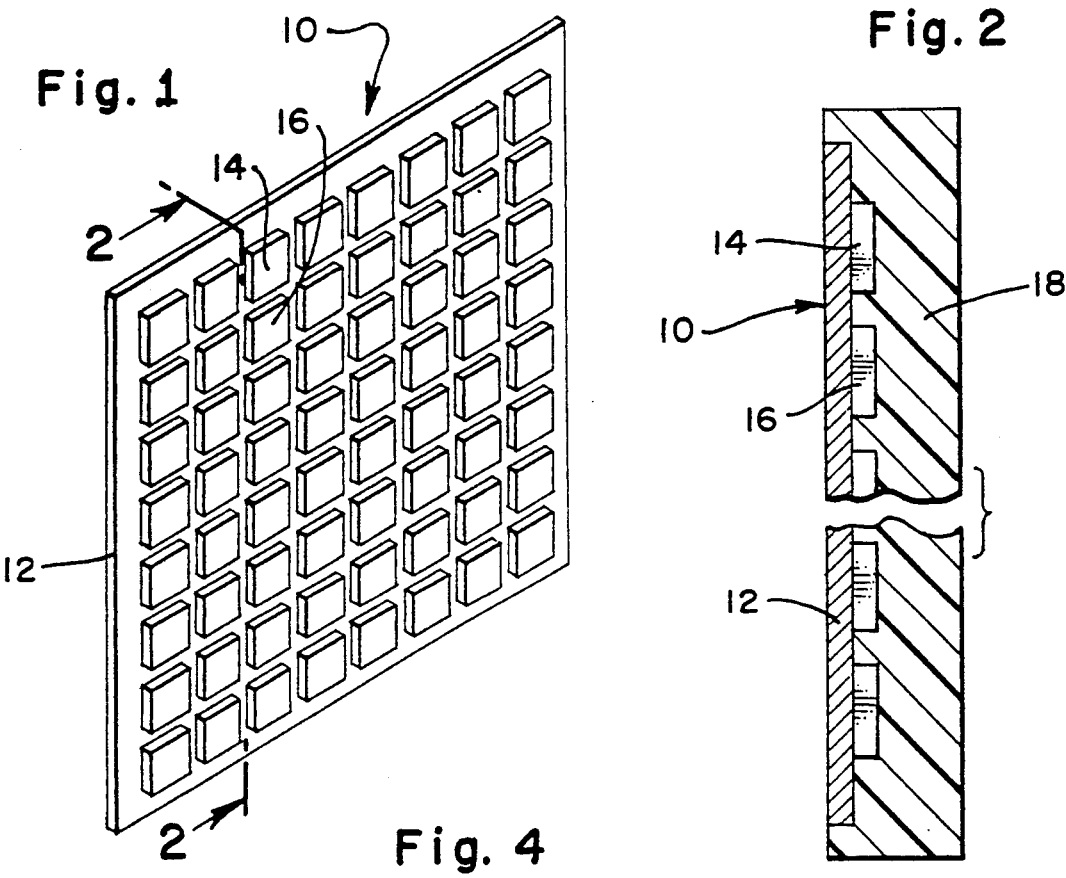
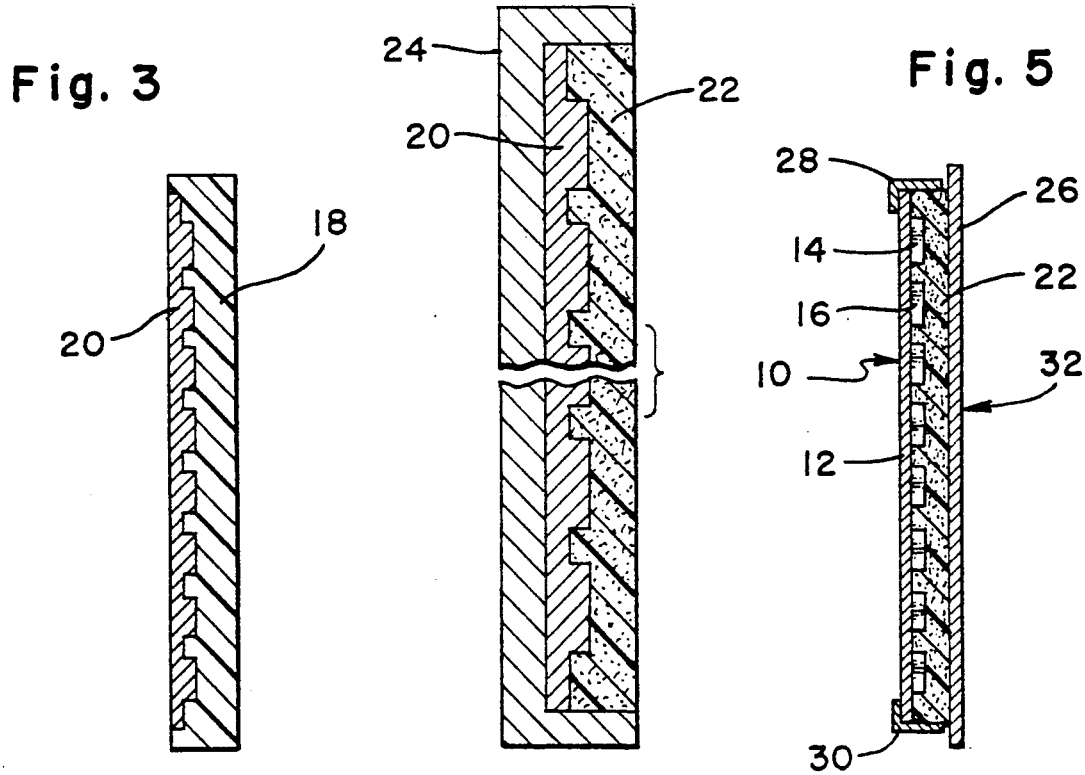

CIRCUIT CARD ASSEMBLY CONDUCTION CONVERTER

This is a continuation-in-part of application Ser. No. 07/936,057, filed Aug. 28, 1992 now abandoned, which is a continuation of 07/651,675 filed Feb. 6, 1991 now abandoned.

FIELD OF THE INVENTION

This invention relates to the adaption for conduction cooling of a circuit card assembly that was originally designed for convection cooling by providing a conduction converter comprised of a metallic thermal mounting plate and a castable polymer between the thermal mounting plate and the top of the components on the component side of a printed wiring board.

BACKGROUND OF THE INVENTION

Semiconductor components are mounted on a printed wiring board, usually on one side thereof. Cooling of such printed wiring boards with their associated semiconductor devices is required to keep the semiconductor devices below their critical temperature. The most common way of cooling such circuit card assemblies is by blowing air thereover. Of course, such air cooling has definite limits as to the amount of heat that can be removed, especially when the circuit card assembly is densely packed with electronic components or applied in an environment where direct external air impingement to the circuit card is undesirable or forbidden. Furthermore, such circuit card assemblies must be spaced so that adequate air can flow therebetween for cooling. Conductive cooling has been attempted by fitting of thermal mounting plates directly against the semiconductor device packages, usually between the component and the circuit card. Such thermal mounting plates are difficult to construct and often have poor thermal pathways due to long, thin thermal conductive sections. The thickness of the material is limited due to component lead lengths, and the thickness of the printed wiring board. Attempts to cool the semiconductor packages on the circuit card assembly by contact to the surfaces away from the printed wiring board have been unsuccessful due to the different sizes and heights of the packages. There is still need for a conduction cooling structure and method of making the structure by which a group of various sized electronic packaged devices assembled on a circuit card can be conductively cooled.

The uniqueness of this invention is that it provides a method for converting circuit card assemblies that were designed for direct air impingement convection cooling to one which will cool the electronics by means of conduction without redesigning the circuit card. It provides a removable, for repair, externally applied thermal mounting plate (conduction converter) that will cool the electronics conductively in a manner equal or superior to forced convection cooling. This represents significant saving of engineering labor required to redesign the circuit card.

SUMMARY OF THE INVENTION

In order to aid in the understanding of this invention, it can be stated in essentially summary form that it is directed to a circuit card assembly conduction converter and method wherein the converter is a castable body which is cast to directly engage on the components on the circuit card assembly and the converter includes a thermal mounting plate by which heat can be conductively extracted from each of the components on the circuit card assembly through the thermal mounting plate to the cold plates at the next higher assembly. The method includes the steps of forming the castable body of the conduction converter in the proper configuration to thermally engage the components on the circuit card assembly.

It is thus a purpose and advantage of this invention to provide a conduction converter which makes direct contact with the components on a circuit card assembly for the conductive cooling of those components.

It is a further purpose and advantage of this invention to provide a conduction converter in the form of a castable body which is cast specifically for the particular profile of the circuit card assembly to thermally engage the components thereon.

It is a further purpose and advantage of this invention to add a thermal mounting plate to any existing circuit card assembly so the circuit card assembly will be converted to conduction cooling by conductively cooling each of the components on the circuit card assembly without rearranging the components on the circuit card to minimize the thermal path length of the highest dissipating components to the card edges.

It is another purpose and advantage of this invention to provide a method by which a castable body is formed to the configuration of the components on a circuit card assembly so that a castable body can be connected to a thermal mounting plate for the extraction of heat from the components and the printed wiring board they are on with minimum thermal path length.

Other purposes and advantages of this invention will become apparent from a study of the following portion of this specification, the claims and the attached drawings wherein:

BRIEF DESCRIPTION OF THE DRAWINGS

FIG. 1 is an isometric view of a circuit card assembly of electronic components on a printed wiring board, shown from the component side.

FIG. 2 is an enlarged section through the board, with parts broken away, as seen generally along the line 2—2 of FIG. 1, showing molding compound engaged against the component side of the printed wiring board to form a negative image of the board.

FIG. 3 is a similar view, on reduced scale, showing a positive mold being formed against the negative mold of FIG. 2.

FIG. 4 is a view on similar scale to FIG. 3 showing the molding of a castable conductive body against the positive mold of FIG. 3.

FIG. 5 is a view on similar scale to FIG. 3, showing the conduction converter comprised of a castable body being mounted on a thermal mounting plate and engaged against the circuit card assembly for cooling of the circuit card assembly and the components thereon.

DESCRIPTION OF THE PREFERRED EMBODIMENT

Figure 6:
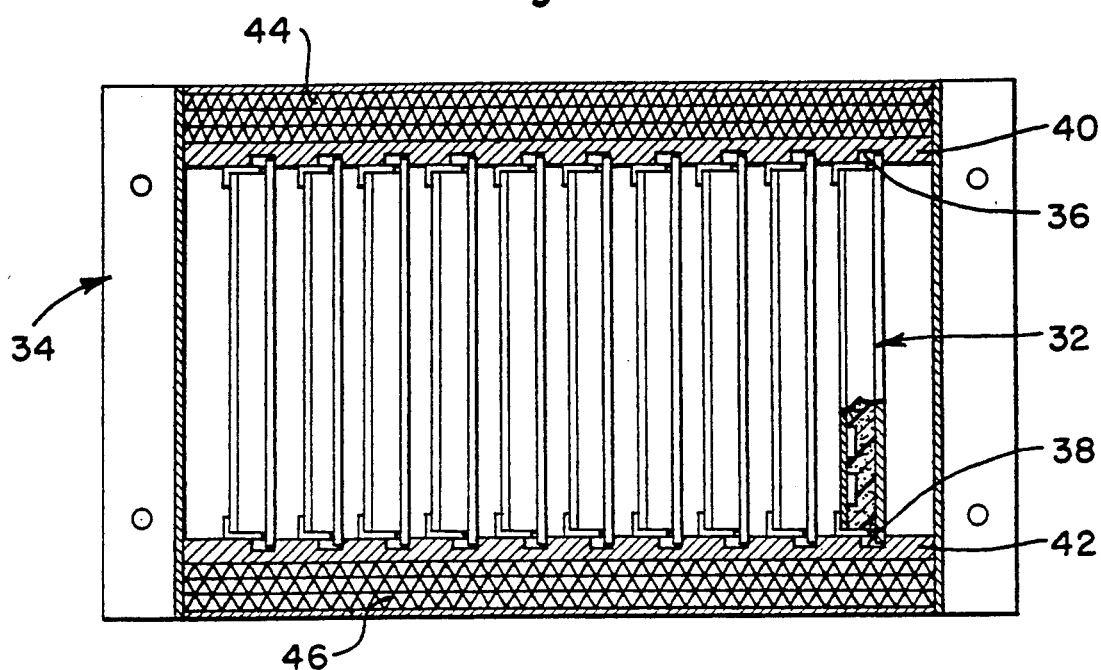
FIG. 6 is a front view, with the front broken away and parts taken in section, of a card box containing a plurality of the circuit card assemblies and conduction converters assembled together for the cooling thereof.

A circuit card assembly is generally indicated at 10 in FIGS. 1, 2 and 5. The circuit card assembly 10 comprises a printed wiring board 12 on which is mounted a group of electronic circuit devices. The devices may be resistors or capacitors, but are more usually semiconductor devices. The semiconductor devices may be single junction devices or may be integrated circuit devices. Each of the devices is in its own package which has multiple external connections for connection to the circuitry in the printed wiring board. Electronic devices 14 and 16 are particularly indicated in FIGS. 1, 2 and 5, as exemplary of the plurality of devices mounted on and electrically connected to the printed wiring board. While a series of square electronic devices is shown in FIG. 1, in most cases the electronic devices will have various sizes and shapes. The integrated circuit devices are most likely to be rectangular, for such is their conventional packaging.

The printed wiring board has connections for connection to the remaining parts of the circuit. As will be seen below, there are edge connectors on the board so that the circuit card assembly 10 may be readily installed and removed. Furthermore, in complex circuits, there is usually a plurality of the circuit card assemblies, with each assembly lying parallel and next to each other so that air can be blown thereover for convective cooling of the electronic devices in the assemblies. For dense circuitry or those whose environment does not allow direct air impingement to the circuit card, such convection cooling is not appropriate and conduction cooling is more favorable in removing the heat generated. In accordance with this invention, a conduction converter is easily created for each circuit card assembly.

The first step in creating the conduction converters is shown in FIG. 2 wherein an impression transfer mold 18 is pressed onto the electronic device side of the circuit card assembly. The impression transfer mold 18 is made of a putty-like material to take the negative impression of the shape. If there are undercuts under the electronic devices on the printed wiring board, preliminary to the taking of this negative image impression transfer mold, the undercuts are filled. A suitable material to fill the undercuts is WSM70 available from Centranic Devices. In making the mold 18, the electronic device side of the circuit card assembly is sprayed with a mold release agent, such as MS-122 fluorocarbon after the undercuts are filled.

The molding material 18 is held in a box, and the electronic device side of the circuit card assembly is pressed into the molding material. A suitable molding material is General Electric silicone rubber mold-making material RTV-11. The molding material is allowed to cure for 25 hours at 25° C. followed by a 1-hour fast cure at 150° F. Thereupon, the circuit card assembly is removed and is cleaned of all mold release and undercut filling material by vapor degreasing. The circuit card assembly is then back in its original condition.

The next step is to create a positive image transfer mold 20, seen in FIGS. 3 and 4. The positive transfer mold 20 is made by installing the negative mold 18 in a box, spraying the negative mold configuration with a mold release agent, such as MS-122 fluorocarbon, described above. After the mold release agent is in place, the positive mold 20 is created by filling the negative mold with a urethane casting elastomer, such as Uralite 3125. Other similar casting materials can be conveniently used. The casting material is allowed to cure. For the urethane casting elastomer described above, 24 hours at room temperature provides a suitable cure. Next, the negative mold 18 is removed to leave the positive transfer mold image 20.

Next, the castable body 22 is formed. As a first step, the positive transfer mold 20 is placed in a casting box and its entire surface is sprayed with a mold release agent, such as MS-122 fluorocarbon, as described above. Thermal mounting plate 26 is of thermally conductive material and is of larger lateral dimension than the printed wiring board 12. Copper is a suitable material, although aluminum has a high coefficient of thermal conduction and, since it is lighter, it may be more useful in some situations. Assuming that the thermal mounting plate 26 is made of copper, it is prepared by vapor degreasing and then applying a thin coat of General Electric primer SS-4155. The primer is allowed to dry at ambient temperature for one hour.

Next, the casting box 24 is filled with a thermally conductive castable body material. Castability, resiliency and high thermal conductivity are the required characteristics. RTV silicone rubber, such as Eccosil 4954 is suitable. The casting material is a thermally conductive casting resin such as polysulphide filled with alumina. When the casting resin 22 is in place, the thermal mounting plate 26 is seated thereon for attachment with a lowest thermal resistance. Curing of the body of thermal casting material described above is accomplished at 150° F. for a minimum of one hour. When cured, the metal thermal mounting plate 26 is already attached to the low thermal resistance castable body 22, and the shape of the face of the resilient castable body 22 is shaped to exactly receive the electronic devices of the circuit card assembly.

When the conduction converter, which includes the castable body 22 and thermal mounting plate 26, is cured, it is removed from its casting box 24. Thereupon, it is applied in face-to-face relationship with the circuit card assembly, with the recesses in the body 22 exactly receiving the electronic devices on the printed wiring board, as shown in FIG. 5. Resiliency of the casting body overcomes any dimensional changes which might occur during the process. When installed in this way, the conduction converter is semi-permanently attached to the circuit card assembly. A convenient attachment may be by detachable clips 28 and 30, shown in FIG. 5, or by applying conventional screw, washer, nut hardware utilizing existing holes in the circuit card that are matched with the thermal mounting plate. The completed conduction-cooled circuit card assembly is generally indicated at 32 in FIG. 5.

FIG. 6 shows a card box 34 in which a plurality of conductively cooled circuit card assemblies is installed. The circuit card assembly 32 is shown at the right of FIG. 6. As is seen in FIGS. 5 and 6, the metal thermal mounting plate extends above and below the circuit card assembly. It engages in grooves 36 and 38 in cold plates 40 and 42. The cold plates 40 and 42 are cooled by means of fins 44 and 46 thermally connected thereto. The thermal mounting plates are clamped into the cold plates, and the cold plates are cooled by any suitable means, such as air blowing over the fins. Forced draft is preferably provided, as is described below with respect to FIG. 7. In this way, a large number of the conductively cooled circuit card assemblies can be installed close together in a card box and can be suitably cooled. Instead of air flowing over fins, the cold plates can be liquid-cooled or refrigerant-cooled.

Figure 7:
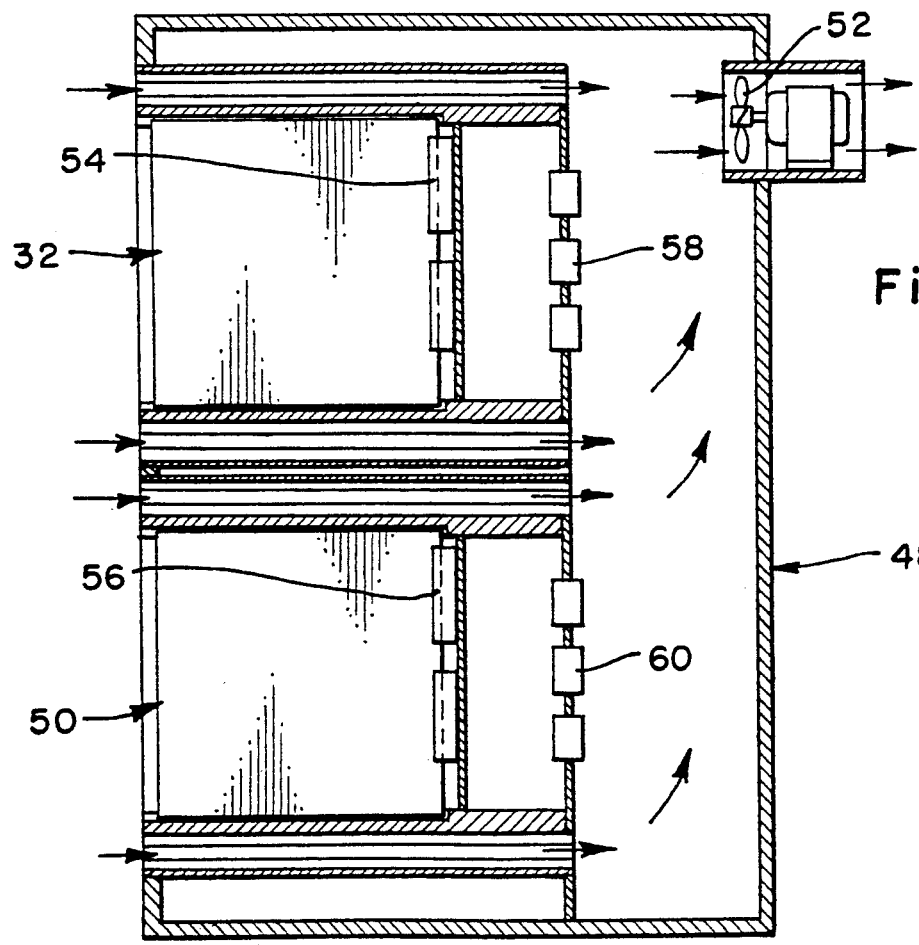
FIG. 7 is a vertical section through a card box similar to that shown in FIG. 6, showing two such card boxes in a housing.

If FIG. 6 is considered a front elevational view, FIG. 7 is a vertical section through a card box. In FIG. 7, the card box 48 is illustrated as having an upper slot containing conductively cooled circuit card assembly 32, the same as the slot containing card 32 in FIG. 6, and identical lower slot carrying conductively cooled circuit card assembly 50, which is the same as card 32. Above and below each of the cards 32 and 50 in FIG. 7 are cold plates, and adjacent each cold plate there are fins. Ambient air is drawn through the fins by means of fan 52, which exhausts the card box behind the conductively cooled circuit card assemblies therein. Instead, liquid could be used for cooling. In FIG. 7, there is a plurality of the card assemblies lying parallel to each other, the same as in FIG. 6. In this way, a great density of card assemblies can be achieved in a card box. Connectors 54 and 56 respectively connect the card assemblies 32 and 50 to the circuitry in the card box. Often, flexible cables are used from such connectors. Junction boxes 58 and 60 are joined to the connectors at the back of the cooled card assemblies and attach to the cold plates to seal the card box interior from external air. It is, thus, seen that the air draft is drawn through and over the fins attached to the cold plates of the card box assemblies. The heat extraction is directly from the top of the electronic devices by conductive cooling through the thermal mounting plate to the card box cold plates from where it is dissipated into the air, or in the case of liquid cooling, through the water or refrigerant.

Figure 8:
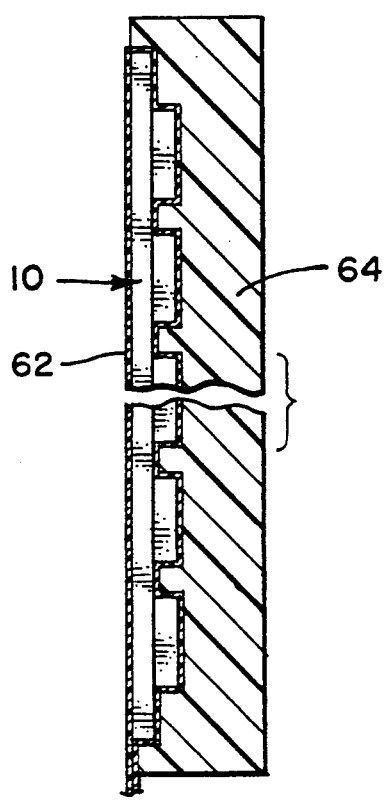
FIG. 8 is a view similar to FIG. 2 showing the first step in a second process for making the conduction converter.
Figure 9:
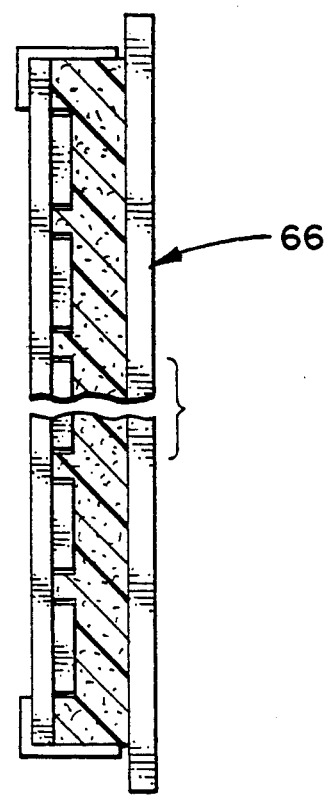
FIG. 9 is a view similar to FIG. 5 showing the completed conduction converter made by the process of FIG. 8.

FIGS. 8 and 9 show another manner in which the castable body and thermal mounting plate are achieved. The circuit card assembly 10 is the same in FIG. 8 as it was in FIG. 1. In the method illustrated in FIG. 8, bag 62 is placed around the circuit card assembly 10. Keeping the component side as smooth as possible, a vacuum is drawn on the bag to form a blister package which closely profiles the electronic devices and the printed wiring board of the circuit card assembly 10. The bag is a flexible polymer composition material bag which contains material to make it electrically conductive so that static voltage cannot build up thereon. Such bags are well known in circuit card assembly manufacturing and are employed to protect circuit card assemblies against dirt contamination and electrical charges. The bag 62 overcomes the need for filling undercuts around the electronic devices or for the negative or positive molding steps. Once the bag is in place and evacuated, the structure is ready for the step illustrated in FIG. 4 where a negative impression transfer mold is created. In FIG. 8, this is mold 64 which corresponds to mold 18. After the step illustrated in FIG. 8, the steps in FIGS. 3 and 4 follow. The finished conductively cooled circuit card assembly is indicated at 66 in FIG. 9. The conductively cooled circuit card assembly 66 is almost identical to that of assembly 32 shown in FIG. 5. The bag 62 is removed before the assembly made up. Thus, there is some side clearance around the electronic devices in FIG. 9. This aids in fitting.

Figure 10:
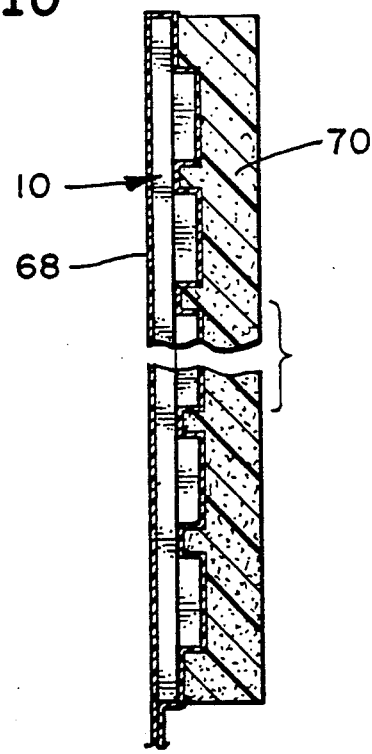
FIG. 10 is a view similar to FIG. 8 showing the first step in a third process for making the conduction converter.
Figure 11:
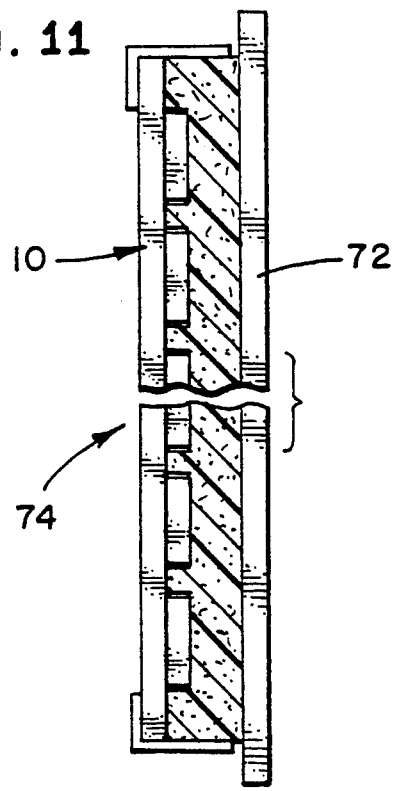
FIG. 11 is a view similar to FIG. 9 showing the completed conduction converter made by the process of FIG. 10.

In FIG. 10, an electrostatic discharge bag 68, the same as bag 62, is wrapped around circuit card assembly 10 and evacuated in the same manner as shown in FIG. 8. In the process illustrated in FIGS. 10 and 11, rather than go through the intermediate molding steps, a thermally conductive casting body 70 is directly molded onto the electronic device side of assembly 10 over the bag 68. The material of body 70 is the same as the material of body 22. Thermal mounting plate 72 is directly joined to the casting body 70 to make a conduction cooler directly fitted to the circuit card assembly. The bag 68 is removed from the circuit card assembly 10, and the circuit card assembly 10 is installed with its electronic devices in the corresponding recesses in the casting body of the conduction converter on the thermal mounting plate. In this way, a conductively cooled circuit card assembly 74 is formed. This is the same as the conductively cooled circuit card assembly 66 and the conductively cooled circuit card assembly 32. Each is capable of being inserted into appropriate locations in the card box. In the card box, each conductively cooled circuit card assembly passes its heat through the cold plate to thus conductively cool the electronic devices and the printed wiring board therebetween.

This invention has been described in its presently contemplated best modes, and it is clear that it is susceptible to numerous modifications, modes and embodiments within the ability of those skilled in the art and without the exercise of the inventive faculty. Accordingly, the scope of this invention is defined by the scope of the following claims.

What is claimed is:

1. A conductively cooled circuit card assembly comprising:
   a printed wiring board, and electronic devices mounted on one side of said printed wiring board to comprise a circuit card;
   a substantially flat plate-like body of a highly thermally conductive, electrically insulating, and resilient material, said plate-like body having opposing substantially flat surfaces, a first flat surface and a second flat surface, said second flat surface having recesses corresponding in shape and relative location of the electronic devices mounted on said printed wiring board, said plate extending over the electronic devices on said printed wiring board, plate-like body being maintained against said printed wiring board with the electronic devices being disposed in said recesses;
   a thermal mounting plate mounted on and in high thermal contact with said first flat surface of said plate-like body; and
   means for maintaining said second side of said plate-like body against said printed wiring board.

2. A conductively cooled circuit card assembly as recited in claim 1 wherein said thermal mounting plate has edges that extend beyond said printed wiring board for thermal connection to an external cold plate.

* * * * *